US005702281A

United States Patent [19]

Huang et al.

[11] Patent Number: 5,702,281

[45] Date of Patent: Dec. 30, 1997

[54] FABRICATION OF TWO-PART EMITTER FOR GATED FIELD EMISSION DEVICE

[75] Inventors: Jammy Chin-Ming Huang, Taipei; David Nan-Chou Liu, Fong-Yuani, both of Taiwan

[73] Assignee: Industrial Technology Research Institute, Hsinchu, Taiwan

[21] Appl. No.: 425,461

[22] Filed: Apr. 20, 1995

[51] Int. Cl.$^6$ .................... H01J 9/00; H01J 9/04; H01L 29/86; H01L 29/12

[52] U.S. Cl. .................... 445/50; 445/24; 257/10

[58] Field of Search .................... 313/336, 309; 445/50, 24

[56] References Cited

U.S. PATENT DOCUMENTS

| | | | |
|---|---|---|---|
| 3,755,704 | 8/1973 | Spindt et al. | 313/309 |
| 5,064,396 | 11/1991 | Spindt | 445/50 |
| 5,258,685 | 11/1993 | Jaskie et al. | 313/309 |
| 5,341,063 | 8/1994 | Kumar | 313/309 |
| 5,480,843 | 1/1996 | Park et al. | 445/50 |

*Primary Examiner*—Mahshid D. Saadat
*Assistant Examiner*—Jhihan B. Clark
*Attorney, Agent, or Firm*—George O. Saile; Stephen B. Ackerman

[57] ABSTRACT

A two-part field emission structure, and a method for making such a structure, is described. A substrate is provided having a first conductive layer thereon, a first insulating layer over the first conductive layer, a second conductive layer over the first insulating layer, and an opening formed in the first insulating and second conductive layers. A sacrificial layer is formed over the second conductive layer. A bottom portion of the field emitter structure is formed in the opening, by vertical deposition of a conductive material, whereby a third conductive layer, having a collimated channel over the bottom portion, is formed over the sacrificial layer. The formation of the field emitter structure is completed by vertical deposition of a tip material on to the top of the bottom portion of the field emitter structure, whereby a top conductive layer is formed over the third conductive layer. Lastly, the sacrificial layer, the third conductive layer, and the top conductive layer are removed. An optional interface adhesion layer is formed between the bottom portion of the field emitter structure and the tip.

10 Claims, 5 Drawing Sheets

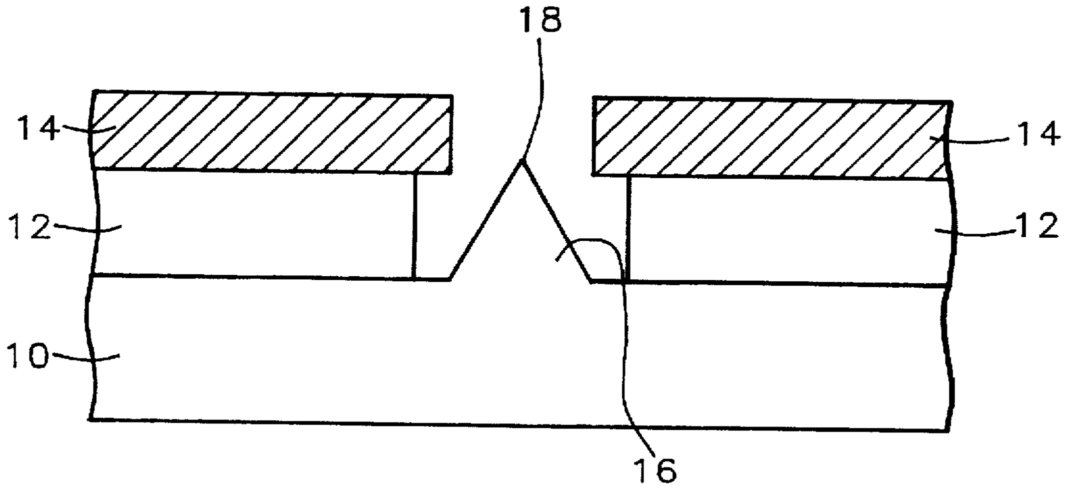
FIG. 1 – Prior Art
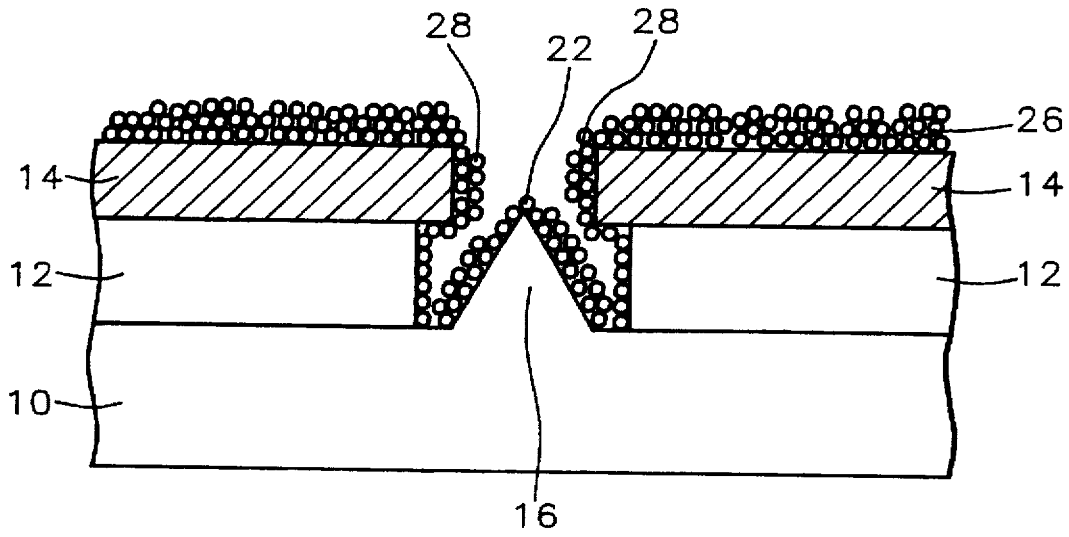
FIG. 2 – Prior Art

FABRICATION OF TWO-PART EMITTER FOR GATED FIELD EMISSION DEVICE

BACKGROUND OF THE INVENTION

1. Field of the Invention

The invention relates to field emission structures, and more particularly to structures and methods of manufacturing field emission devices having two-part emitters.

2. Description of the Related Art

Emission of electrons from conductive material is known to occur in the vicinity of an electric field, through such processes as Fowler-Nordheim tunneling. It is desirable to reduce the field strength required to induce electron emission. This is accomplished primarily by (1) the use of pointed structures at the location of emission, and (2) by using emitting materials with a low work-function. FIG. 1 shows a typical field emitting tip structure, which is utilized in such applications as electron microscopes and field emission displays (FEDs). A conical emitter 16 having a sharp tip 18 is formed on a conductive layer 10. This layer can be used as a conductive path formed on a glass or silicon substrate (not shown). For FEDs, the emitter is metal deposited by evaporation process, or alternately may be formed of silicon using well-known processes from the semiconductor industry including photolithography, deposition and etching. A conductive film 14 is separated from the substrate by a dielectric layer 12. The application of a voltage differential between conductive layers 14 and 10 induces electron emission from tip 18.

A reduction of the field strength necessary to create emission from the field emitter is desirable for several reasons. In an FED; for example, power consumption, driver circuit complexity and cost are lowered by reducing the driving voltage. The voltage must also be low enough so that dielectric breakdown does not occur in dielectric layer 12, which has a typical thickness of about 1 micrometer.

The use of one low work-function material for a field emitter is described in U.S. Pat. No. 5,258,685 (Jaskie et al.), and is shown in FIG. 2. A field emitter 16 is provided, on which a diamond coating 22 is formed, where the diamond coating is fabricated by implanting carbon ions which act as nucleation sites for the diamond film. Diamond deposited in an amorphic form has an extremely low work-function of −0.2 eV. Using the method disclosed by Jaskie et al. has several drawbacks, however. For instance, whereas the field emitter 16 may have had a sharp tip as formed, the formation of the diamond film 22 will reduce this sharpness and require a higher driving voltage. In addition, the use of this diamond process is likely to form a carbon film over the un-implanted area. The undesirable carbon growth along the top 26 and sidewall 28 of gate layer 14, and along the sidewall of dielectric 12, could lead to an undesired short-circuit condition between the conductive layers 14 and 10.

SUMMARY OF THE INVENTION

It is therefore an object of this invention to provide a field emitting structure with a low operating voltage.

It is a further object of this invention to provide a field emitting structure using a low work-function material, without reduction in tip sharpness.

It is a further object of this invention to provide a method of forming a field emitter utilizing low work-function material while maintaining tip sharpness.

It is yet another object of this invention to provide a method of forming a field emitter with low operating voltage using a low cost, simple manufacturing process.

These objects are achieved by the following. A substrate is provided having a first conductive layer thereon, a first insulating layer over the first conductive layer, a second conductive layer over the first insulating layer, and an opening formed in the first insulating and second conductive layers. A sacrificial layer is formed over the second conductive layer. A bottom portion of the field emitter structure is formed in the opening, by vertical deposition of a conductive material, whereby a third conductive layer, having a collimated channel over the bottom portion, is formed over the sacrificial layer. The formation of the field emitter structure is completed by vertical deposition of a tip material on to the top of the bottom portion of the field emitter structure, whereby a top conductive layer is formed over the third conductive layer. Lastly, the sacrificial layer, the third conductive layer, and the top conductive layer are removed. An optional interface adhesion layer is formed between the bottom portion of the field emitter structure and the tip.

These objects are further achieved by a two-part field emission structure in which there is a sandwich structure comprising a second conductive layer over an insulating layer over a first conductive layer, on a substrate. There is an opening in the sandwich structure. A conductive conical base with a flat top surface is formed in the opening and forms the base of the two-part field emission structure. A tip formed on the flat top surface of the conductive conical base completes the two-part field emission structure.

BRIEF DESCRIPTION OF THE DRAWINGS

FIGS. 1 and 2 are cross sectional representations of prior art field emission structures.

DESCRIPTION OF THE PREFERRED EMBODIMENTS

Referring now to FIGS. 3 to 9, the novel method of the invention is described. A conductive layer 31 is provided on a glass or silicon substrate 30, on which is formed an insulating layer 32. Layer 32 has a preferred thickness of between about 0.5 and 2 micrometers, and an operative thickness of between about 0.2 and 5 micrometers, and is formed of silicon oxide ($SiO_2$) or the like, by processes well known in the semiconductor technology such as CVD (Chemical Vapor Deposition).

Figure 3:
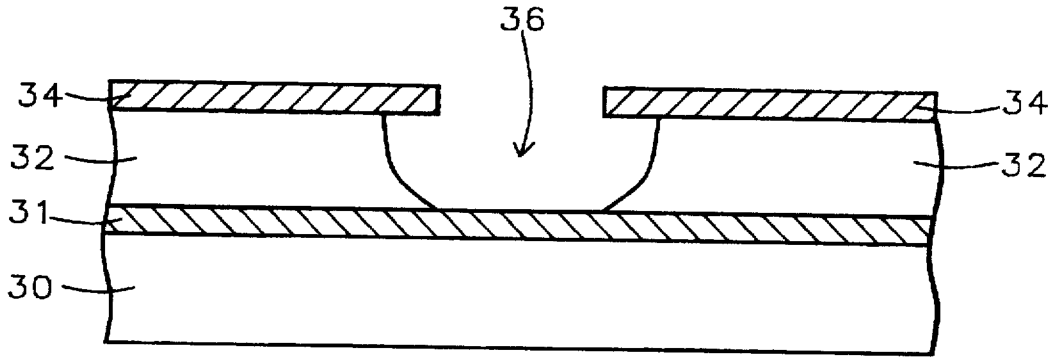
FIGS. 3 to 9 are a cross-sectional representation of the method of the invention, and resultant structures, for forming a two-part field emitter.

A conductive film 34 is next formed over insulator 32, typically of a metal such as aluminum or molybdenum, to a thickness of between about 0.1 and 1 micrometer. An opening 36 is then formed in the layers 34 and 32, as shown in FIG. 3, by anisotropically etching layer 34, after formation of a photoresist mask (not shown), and then an isotropic etch of layer 32, as is known in the art.

Figure 4:
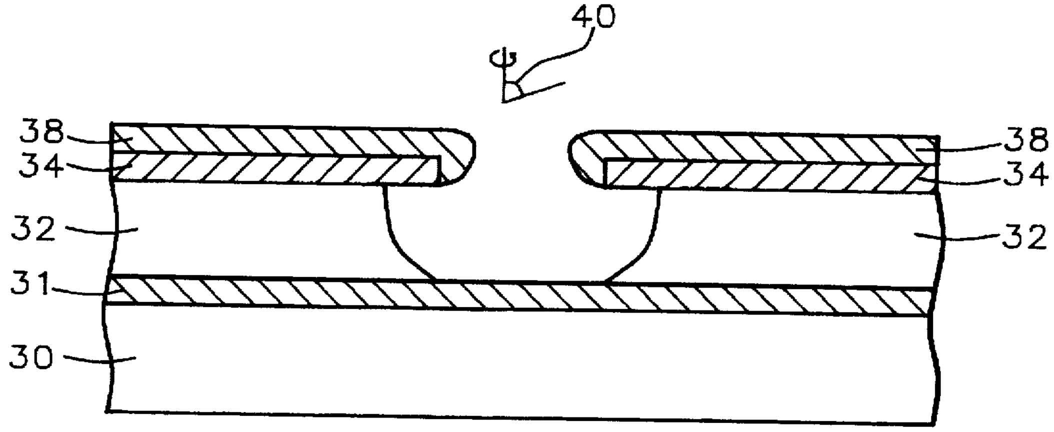

As shown in FIG. 4, a sacrificial layer 38 is formed by graze angle deposition. The wafer on which the structure is being formed is rotated and tilted at an angle 40 of about 75°, so that the sacrificial layer 38 is formed over the top and along the inner sidewalls of conductive layer 34, without any deposition further within opening 36. This layer is formed of aluminum, nickel, or the like by e-beam evaporation, to a thickness of between about 100 and 3000 Angstroms.

Figure 5:
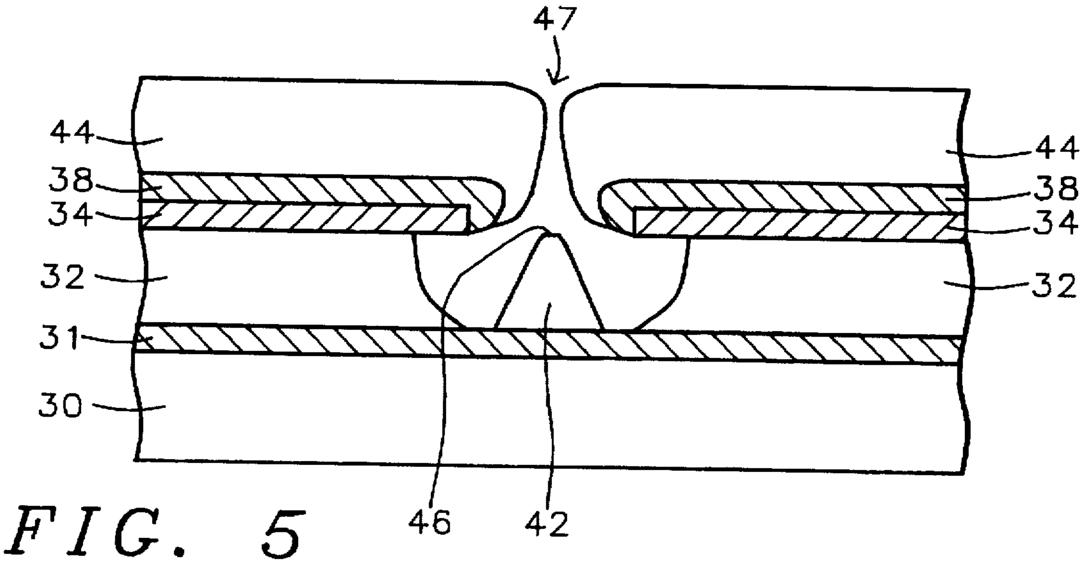
Figure 6:
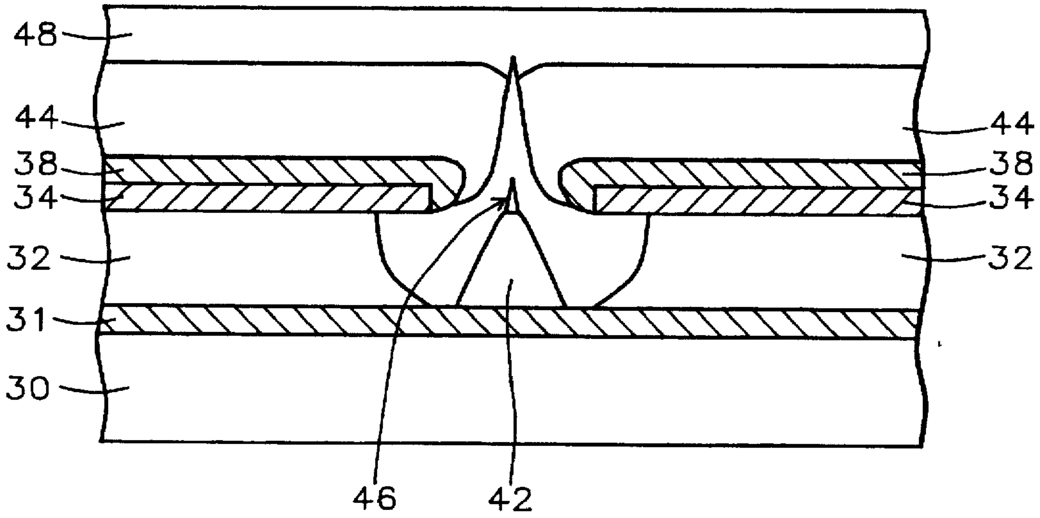

Important steps of the invention are now described, and are depicted in FIGS. 5 and 6. Referring to FIG. 5, the bottom portion 42 of the field emitter is formed by vertical evaporation of molybdenum (Mo), copper (Cu), or the like. In prior art field emitters, the evaporation continues until the top layer 44 completely closes off the opening where the emitter is formed, and the emitter is formed in a single step resulting in a sharp upper tip. In the method of the invention, by comparison, evaporation is stopped prior to closing off of top layer 44, leaving a small flat upper surface 46 on the bottom portion 42 of the emitter. A collimated channel 47 also results which is self-aligned to the emitter bottom portion 42, where the channel allows the use of any non-directional deposition method for the subsequent formation of the emitter tip, to be described. The emitter bottom portion 42 is formed to a preferred height of between about 0.4 and 1.6 micrometers, and an operative height of between about 0.16 and 4 micrometers, or about 80% of the height of the cavity in which the emitter is being formed.

As shown in FIG. 6, the emitter tip 46 is now formed, and has a sharp tip due to the closing off of layer during deposition of the tip material. The desired tip materials have a low work-function, and may be formed of a compound material. A sample of low work-function materials, and their work-functions, are listed in the following table:

TABLE I

| Material | Work Function |
|---|---|
| C (crystalline diamond) | 5.1 |
| Si (silicon) | 4.5 |
| W (tungsten) | 4.6 |
| Cu (copper) | 4.5 |
| Nb (niobium) | 4.3 |
| Mo (molybdenum) | 4.3 |
| Hf (hafnium) | 3.6–3.7 |
| SiC (silicon carbide) | 3.5 |
| TiC (titanium carbide) | 2.7 |
| Ba (barium) | 2.5 |
| TaN (tantalum nitride) | 2.2 |
| Cs (cesium) | 1.9 |
| $Cr_3Si + SiO_2$ (cermet) | 1.0 |
| C (amorphic diamond) | −0.2 |

As noted earlier, a low work-function has the desirable effect of reducing the driving voltage needed to cause electron emission from the field emitter. And the novel method of the invention provides a low work-function material at the site of emission while also providing a sharp tip, further reducing drive voltage, and by means of a simple manufacturing process.

The low workfunction material is deposited by any non-directional process such as sputtering, evaporation, CVD (Chemical Vapor Deposition) or in the case of diamond, by high energy ablation, such as laser ablation. For laser ablation, an Nd:YAG laser, Q-switched, is used and operated at 1.06 micrometers with a 10 hertz repetition frequency. A diamond growth rate of 80 Angstroms/minute over 100 $cm.^2$ is realized on untreated substrates of a variety of materials. Further information is available in "Laser Plasma Diamond", F. Davanloo, et al., Journal of Materials Research, Vol. 5, No. 11, November 1990. The collimated channel 47 forces the deposited material in one direction, which is a necessary condition to forming the sharp tip 46.

An interface adhesion layer (not shown) may optionally be formed between the bottom portion 42 and the tip 46. This layer would be formed of Ti (titanium), Cr (chromium) or the like, as is known in the art, to a thickness of between about 50 and 300 Angstroms, and deposited by electron beam deposition. This layer would be used where improved adhesion is required between the tip and bottom portion of the emitter.

A compound material such as TiC, TaN or $Cr_3Si+SiO_2$ may be used to form emitter tip 46. These materials could be deposited by sputtering, or co-sputtering to maintain their original constituents.

Figure 7:
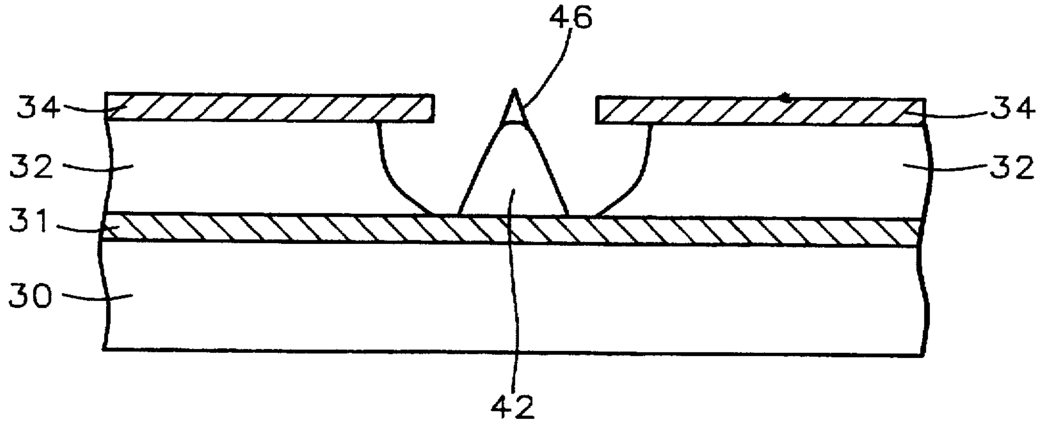

Referring now to FIG. 7, the emitter device is completed by etching the sacrificial layer 38, which results in the lift-off of all subsequently formed layers above the sacrificial layer. Etching is accomplished using, e.g., hydrochloric acid (HCl), which etches the sacrificial layer without affecting the tip material.

Figure 8:
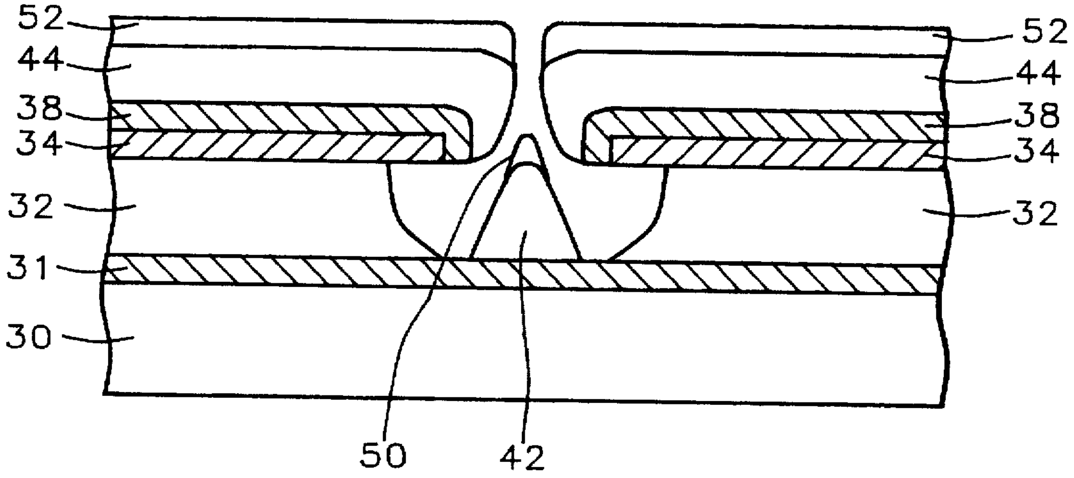
Figure 9:
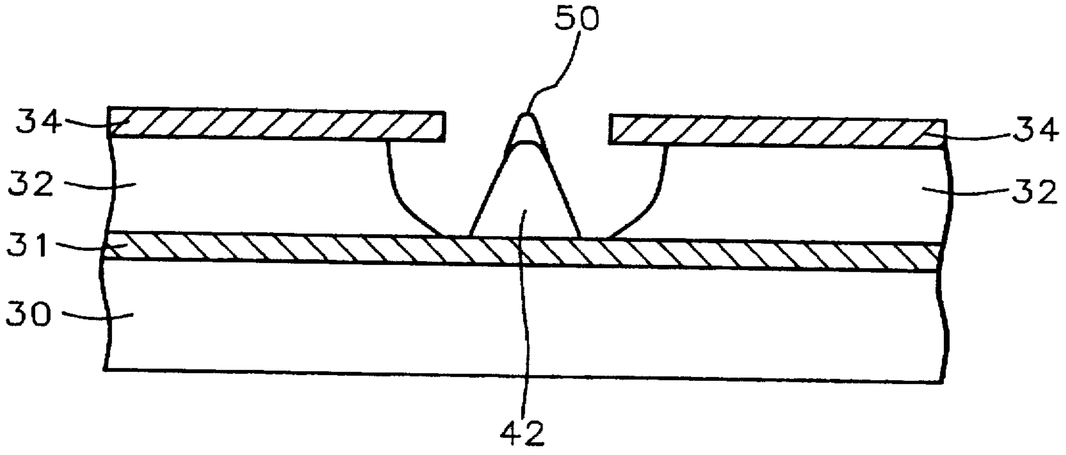

When amorphic diamond is used for the tip, the required current can be produced using the same or lower applied electric field than with other materials, and it has been shown that field enhancement by way of a sharp tip is not required. See "Late-News Paper: Field-Emission Displays Based on Diamond Thin Films", by N. Kumar, et al., SID '93 Digest, pp. 1009–1011, for more information. Thus, a rounded tip structure may be formed, as shown in FIGS. 8 and 9, for an amorphic diamond tip. Starting from the FIG. 5 structure, this could be accomplished by depositing a thin diamond coating 50 at the emitter tip and ending the deposition without closing the top layer 52, as is illustrated in FIG. 8. The sacrificial layer is then dissolved and lift-off of the layers above it completes the field emitter device as shown in FIG. 9.

The advantages of the method and resulting structure of the invention are numerous. The emitter tip sharpness is not changed by the use of a low work-function emitting material. No low work-function material is formed at undesired locations such as on top or sidewalls of the gate, or along the sidewalls of the emitter opening. The deposition of the low work-function material is performed insitu, reducing the cost and complexity of emitter fabrication. Furthermore, the collimated channel 47 will allow different processing technologies to be used for deposit of the tip material. Such in-situ collimated sputter deposition is better than the conventional collimated sputter deposition, which is described in "Collimated Sputter Deposition, a novel method for large area deposition of Spindt type field emission tips", G. N. A. van Veen, et al., IVMC (International Vacuum Microelectronics Conference) '94, pp. 33–36 (Jul. 4–7, 1994).

Figure 10:
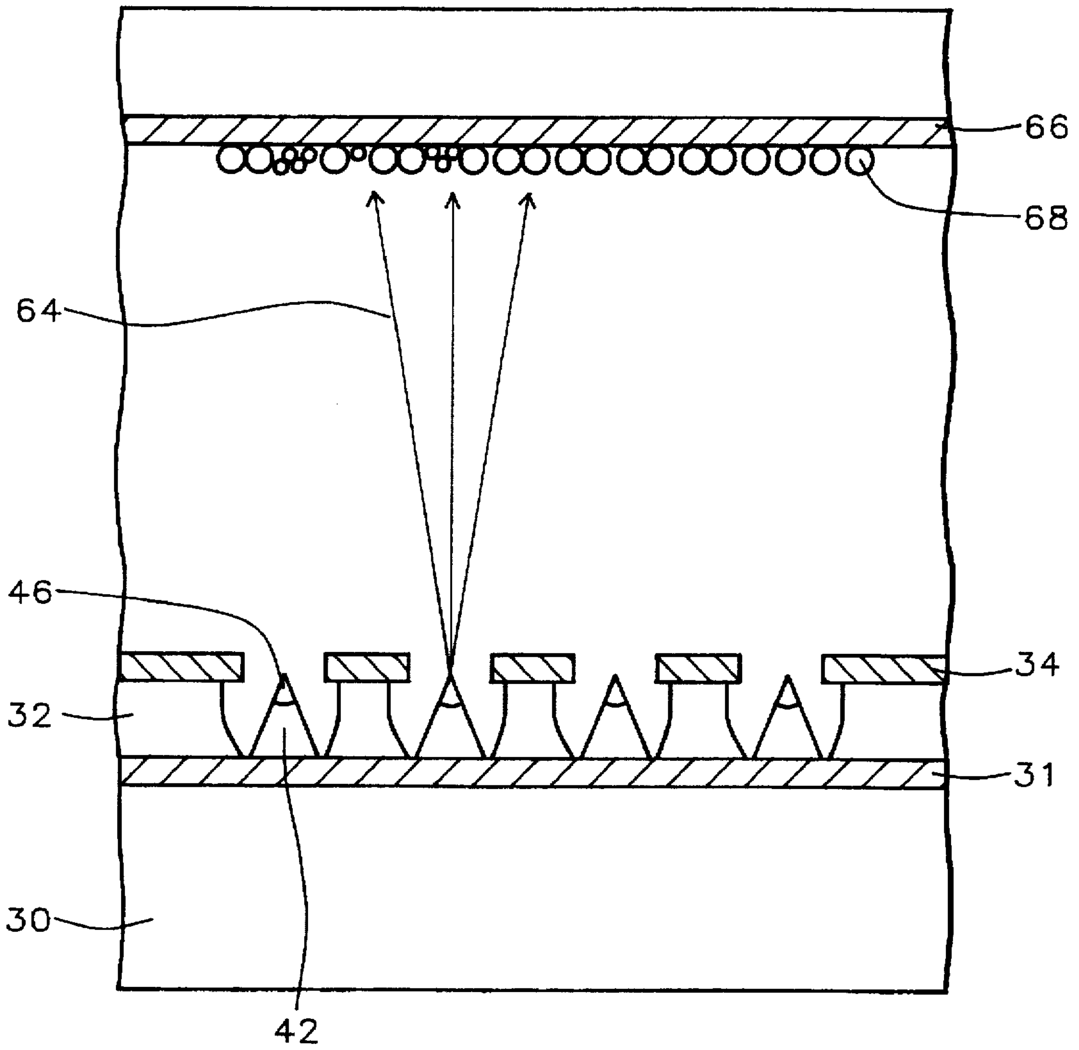
FIG. 10 is a cross-sectional representation of a Field Emission Display (FED) using the two-part emitter structure of the invention.

One application of the novel field emitter of the invention is in a Field Emission Display (FED), as depicted in the cross-sectional view in FIG. 10. A large array of field emitters 42/46 is formed and is addressed via a matrix of cathode columns 31 and gate lines 34. When the proper voltages are applied to the cathode 31 and gate 34, electrons 64 are emitted and accelerated toward the anode 66, which is biased to a higher voltage than the gate. The electrons impinge upon cathodoluminescent material 68, formed on the anode, that produces light when excited by the emitted electrons, thus providing the display image. The anode is mounted in close proximity to the cathode/gate/emitter structure and the area in between is typically a vacuum. The reduced driver voltage and manufacturing complexity made possible by the method of the invention are critical requirements for FEDs, particularly for future high-volume, cost- and power-sensitive applications such as laptop computers.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a field emitter structure, comprising the steps of:

providing a substrate having a first conductive layer thereon, a first insulating layer over said first conductive layer, a second conductive layer over said first insulating layer, and an opening formed in said first insulating and second conductive layers;

forming a sacrificial layer over said second conductive layer;

forming a bottom portion of said field emitter structure is said opening, by vertical deposition of a conductive material, whereby a third conductive layer, having a collimated channel over said bottom portion, is formed over said sacrificial layer;

completing the formation of said field emitter structure by non-directional deposition, through said collimated channel, of a tip material on to the top of said bottom portion of said field emitter structure, whereby a top conductive layer is formed over said third conductive layer and only partially over said collimated channel, whereby the tip of said field emitter structure is formed with a rounded point; and removing said sacrificial layer, said third conductive layer, and said top conductive layer.

2. The method of claim 1 wherein said tip material has a work function of between about −0.4 and 5 eV.

3. The method of claim 2 wherein said tip material is selected from the group consisting of crystalline diamond, silicon, tungsten, copper, niobium, molybdenum, hafnium, silicon carbide, titanium carbide, barium, tantalum nitride, cesium and cermet.

4. The method of claim 1 wherein said forming a bottom portion of said field emitter structure is by evaporation of a metal selected from the group consisting of molybdenum and copper.

5. The method of claim 1 wherein said sacrificial layer is selected from the group consisting of aluminum and nickel.

6. The method of claim 1 wherein said removing said sacrificial layer, said third conductive layer, and said top conductive layer is accomplished by dissolving said sacrificial layer in hydrochloric acid (HCl).

7. The method of claim 1 further comprising forming an interface adhesion layer over said bottom portion of said field emitter structure and under said tip material.

8. The method of claim 7 wherein said interface adhesion layer is selected from the group consisting of titanium and chromium.

9. A method of fabricating a field emission display, comprising the steps of:

providing a substrate having a first conductive layer thereon, a first insulating layer over said first conductive layer, a second conductive layer over said first insulating layer, and a plurality of openings formed in said first insulating and second conductive layers; forming a sacrificial layer over said second conductive layer;

forming a bottom portion of a field emitter structure in each of said openings, by vertical deposition of a conductive material, whereby a third conductive layer, having a collimated channel over said bottom portion, is formed over said sacrificial layer;

completing the formation of a field emitter structure in each of said openings, by non-directional deposition, through said collimated channel, of a tip material on to the top of said bottom portion of a field emitter structure, whereby a top conductive layer is formed over said third conductive layer and only partially over said collimated channel, whereby the tip of said field emitter structure is formed with a rounded point;

removing said sacrificial layer, said third conductive layer, and said top conductive layer; and mounting the resulting structure to a faceplate having a transparent base and phosphorescent material formed thereon, to complete said field emission display.

10. The method of claim 12 wherein said tip material has a work function of between about −0.4 and 5 eV, and is selected from the group consisting of crystalline diamond, silicon, tungsten, copper, niobium, molybdenum, hafnium, silicon carbide, titanium carbide, barium, tantalum nitride, cesium and cermet.

* * * * *